US012677697B2

(12) United States Patent
Abdul Razak et al.

(10) Patent No.: US 12,677,697 B2
(45) Date of Patent: Jul. 7, 2026

(54) CERAMIC PACKAGE CAPACITORS

(71) Applicant: TEXAS INSTRUMENTS INCORPORATED, Dallas, TX (US)

(72) Inventors: Ramlah Binte Abdul Razak, Plano, TX (US); Hector Torres, Lucas, TX (US); Kevin Ziemer, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 919 days.

(21) Appl. No.: 17/855,277

(22) Filed: Jun. 30, 2022

(65) Prior Publication Data

US 2023/0343767 A1      Oct. 26, 2023

Related U.S. Application Data

(60) Provisional application No. 63/334,480, filed on Apr. 25, 2022.

(51) Int. Cl.
*H10W 90/00* (2026.01)
*H01G 4/012* (2006.01)
*H01G 4/228* (2006.01)

(52) U.S. Cl.
CPC ............ *H10W 90/00* (2026.01); *H01G 4/012* (2013.01); *H01G 4/228* (2013.01); *H10W 90/759* (2026.01)

(58) Field of Classification Search
CPC ..................... H01L 25/16; H01L 24/48; H01L 2224/48195; H01L 2924/19041; H01L 25/0655; H01L 23/642; H01L 23/10; H01G 4/012; H01G 4/228; H01G 4/33; H01G 4/38; H01G 4/40
See application file for complete search history.

(56) References Cited

U.S. PATENT DOCUMENTS

| | | | |
|---|---|---|---|
| 2004/0056341 A1* | 3/2004 | Endo ....................... | H01L 23/50 |
| | | | 257/E23.079 |
| 2013/0189935 A1* | 7/2013 | Nair ......................... | H01Q 1/38 |
| | | | 343/700 MS |
| 2015/0243609 A1* | 8/2015 | Lamorey ............... | H01L 25/165 |
| | | | 361/717 |
| 2017/0373008 A1* | 12/2017 | Constantino ...... | H01L 23/49537 |
| 2020/0043825 A1* | 2/2020 | Brito ........................ | H01L 24/49 |
| 2022/0139797 A1* | 5/2022 | Takahashi ............. | H01L 25/072 |
| | | | 257/712 |
| 2023/0395454 A1* | 12/2023 | Tanaka ................. | H01L 23/3192 |
| 2024/0063108 A1* | 2/2024 | Kon ................... | H01L 23/49838 |
| 2024/0234338 A1* | 7/2024 | Saito ....................... | H01L 23/02 |

* cited by examiner

*Primary Examiner* — Ratisha Mehta
*Assistant Examiner* — Sophia W Kao
(74) *Attorney, Agent, or Firm* — Dawn Jos; Frank D. Cimino

(57) ABSTRACT

In examples, a ceramic semiconductor package includes a first semiconductor die; a second semiconductor die; and a ceramic body including a ceramic member. The ceramic member comprises a first conductor on a top surface of the ceramic member and a second conductor. The second conductor includes a first member on the top surface of the ceramic member and separated from the first conductor, the first member coupled to a device side of the first semiconductor die; and a second member coupled to the first member by a vertical member, the second member extending horizontally within the ceramic member parallel to and coinciding vertically with the first conductor, the second member coupled to a device side of the second semiconductor die.

20 Claims, 10 Drawing Sheets

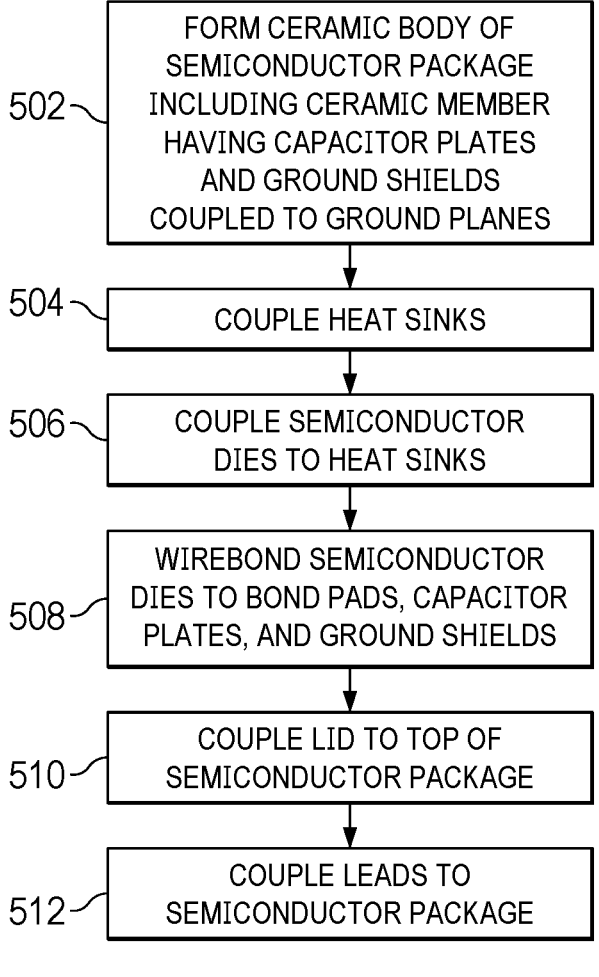

502 — FORM CERAMIC BODY OF SEMICONDUCTOR PACKAGE INCLUDING CERAMIC MEMBER HAVING CAPACITOR PLATES AND GROUND SHIELDS COUPLED TO GROUND PLANES

504 — COUPLE HEAT SINKS

506 — COUPLE SEMICONDUCTOR DIES TO HEAT SINKS

508 — WIREBOND SEMICONDUCTOR DIES TO BOND PADS, CAPACITOR PLATES, AND GROUND SHIELDS

510 — COUPLE LID TO TOP OF SEMICONDUCTOR PACKAGE

512 — COUPLE LEADS TO SEMICONDUCTOR PACKAGE

FIG. 5

CERAMIC PACKAGE CAPACITORS

CROSS-REFERENCE TO RELATED APPLICATIONS

The present application claims priority to U.S. Provisional Patent Application No. 63/334,480, which was filed Apr. 25, 2022, is titled "Intra Package, Ceramic Dielectric Capacitor Integration On Ceramic Flat Pack Package," and is hereby incorporated herein by reference in its entirety.

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the "flip-chip" technique, in which the semiconductor chip (also called a "die") is oriented so the device side of the chip (in which circuitry is formed) is facing downward. The device side is coupled to the conductive members using, e.g., solder bumps. Another technique is the wirebonding technique, in which the device side of the semiconductor chip is oriented upward and is coupled to the conductive members using bond wires.

SUMMARY

In examples, a ceramic semiconductor package includes a first semiconductor die; a second semiconductor die; and a ceramic body including a ceramic member. The ceramic member comprises a first conductor on a top surface of the ceramic member and a second conductor. The second conductor includes a first member on the top surface of the ceramic member and separated from the first conductor, the first member coupled to a device side of the first semiconductor die; and a second member coupled to the first member by a vertical member, the second member extending horizontally within the ceramic member parallel to and coinciding vertically with the first conductor, the second member coupled to a device side of the second semiconductor die.

BRIEF DESCRIPTION OF THE DRAWINGS

FIG. 5 is a flow diagram of a method for manufacturing a semiconductor package having a ceramic member useful as a capacitor dielectric, in accordance with various examples.

DETAILED DESCRIPTION

Figure 1:
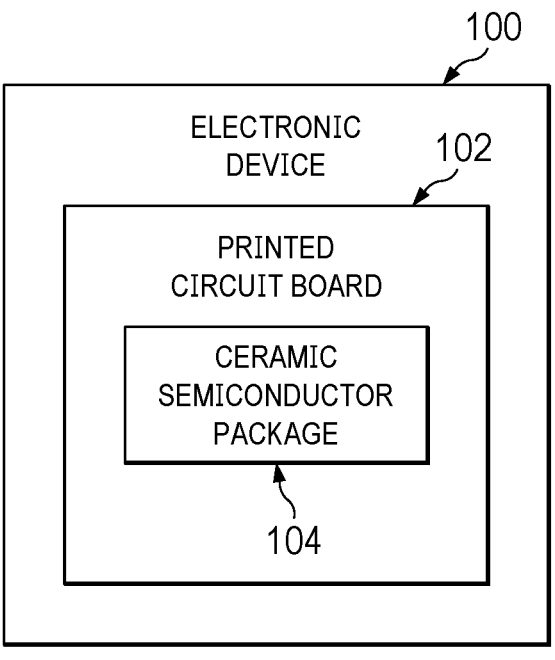
FIG. 1 is a block diagram of an electronic device including a semiconductor package having a ceramic member useful as a capacitor dielectric, in accordance with various examples.

A common goal of most semiconductor chip and package manufacturers is to decrease chip and package size. Although a variety of techniques may be leveraged to realize such decreases in size (e.g., reducing transistor size), some types of components, such as passive components, continue to present size-reduction challenges. For example, some applications may call for capacitors having very low capacitances in the range of 69 femtofarads (fF) or less. Standalone capacitors capable of producing such low capacitances, even if commercially available, would have physical dimensions so large that they would occupy an unacceptable amount of space on a semiconductor chip and, thus, inside a semiconductor package. Alternatively, the large physical dimensions of such capacitors would force manufacturers to increase chip and package size, which is contrary to the common goal of smaller chip and package sizes. Manufacturers wanting to implement very low capacitance capacitors are thus forced to choose between large chip and package size, excessive consumption of space on a chip and in a package, or foregoing the implementation of very low capacitance capacitors altogether.

This disclosure describes examples of a ceramic semiconductor package in which very low capacitance capacitors are formed using the ceramic member of the package as a dielectric layer. Using the ceramic member of the package as a capacitor dielectric layer provides a significant reduction in capacitor space requirements because it uses ceramic material that would already be part of the package regardless of whether a very low capacitance capacitor is included or not. In examples, a ceramic semiconductor package includes a ceramic member positioned within a cavity of the package (e.g., with the ceramic member separating semiconductor chips, or dies, configured to operate in different voltage domains). A first capacitor in the package includes a pair of parallel conductors and a portion of the ceramic member positioned between the pair of parallel conductors. The parallel conductors are capacitor plates and the ceramic positioned between the parallel conductors is a dielectric layer. In examples, one of the parallel conductors is on a top surface of the ceramic member and the other one of the parallel conductors is inside the ceramic member. By positioning one of the parallel conductors inside the ceramic member, space within the cavity of the package is preserved.

A second capacitor in the package includes a pair of conductors separated by air. The pair of conductors may be positioned on the top surface of the ceramic member. The pair of conductors are capacitor plates, and the air between them is a dielectric layer.

In examples, the first and second capacitors have one or more conductors in common. For example, the ceramic member may include a first conductor on the top surface of the ceramic member and a second conductor that has first and second members, the first member on the top surface of the ceramic member (and separated from the first conductor by air) and the second member inside the ceramic member (and separated from the first conductor by ceramic). The first and second members of the second conductor may be coupled by a third member extending vertically within the ceramic member. Thus, the first and second capacitors are configured to provide two different capacitances. Because the first and second capacitors are configured in parallel in some examples, the first and second capacitors together may be considered to form a single capacitor that has a capacitance that is a combination of the capacitances of the first and second capacitors. In examples, the combined capacitance is a very low capacitance value (e.g., less than 69 fF, less than 65 fF). In examples, the second member of the second conductor is parallel to the first conductor and to the first member of the second conductor.

FIG. 1 is a block diagram of an electronic device 100, in accordance with various examples. The electronic device 100 may be a laptop computer, a desktop computer, a notebook computer, a smartphone, a digital reader, an appliance (e.g., refrigerator, television, air conditioning unit, security system), a vehicle (e.g., ground vehicle, aircraft, or spacecraft), or any other suitable electronic device. The electronic device 100 includes a printed circuit board (PCB) 102. In examples, the electronic device 100 includes multiple PCBs 102. In examples, the PCB 102 has coupled thereto a ceramic semiconductor package 104. Various structural examples of the ceramic semiconductor package 104 and methods of their manufacture are described below with reference to FIGS. 2A-5.

Figure 2A:
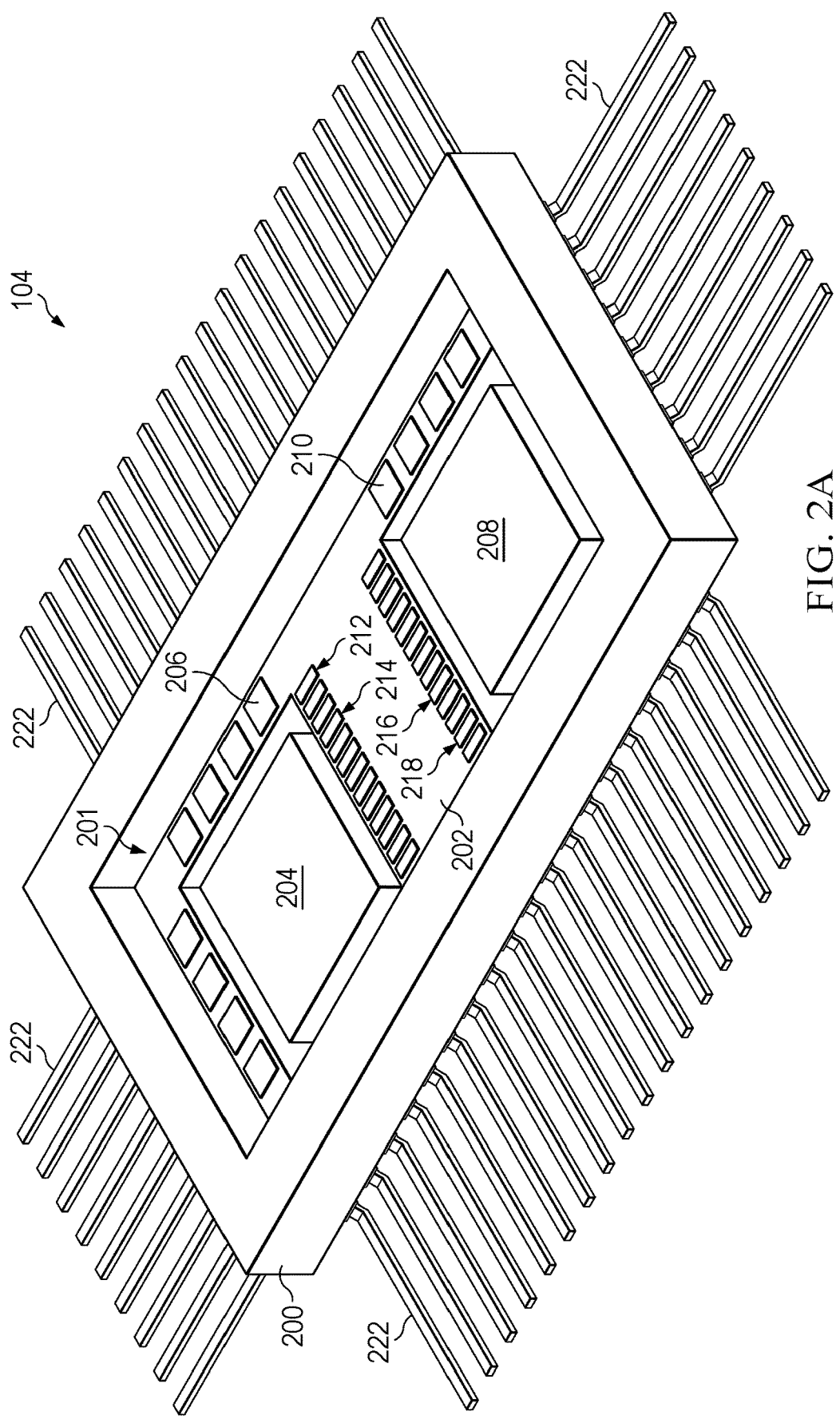
FIGS. 2A, 2B, and 2C are perspective, top-down, and bottom-up views, respectively, of a semiconductor package having a ceramic member useful as a capacitor dielectric, in accordance with various examples.
Figure 2B:
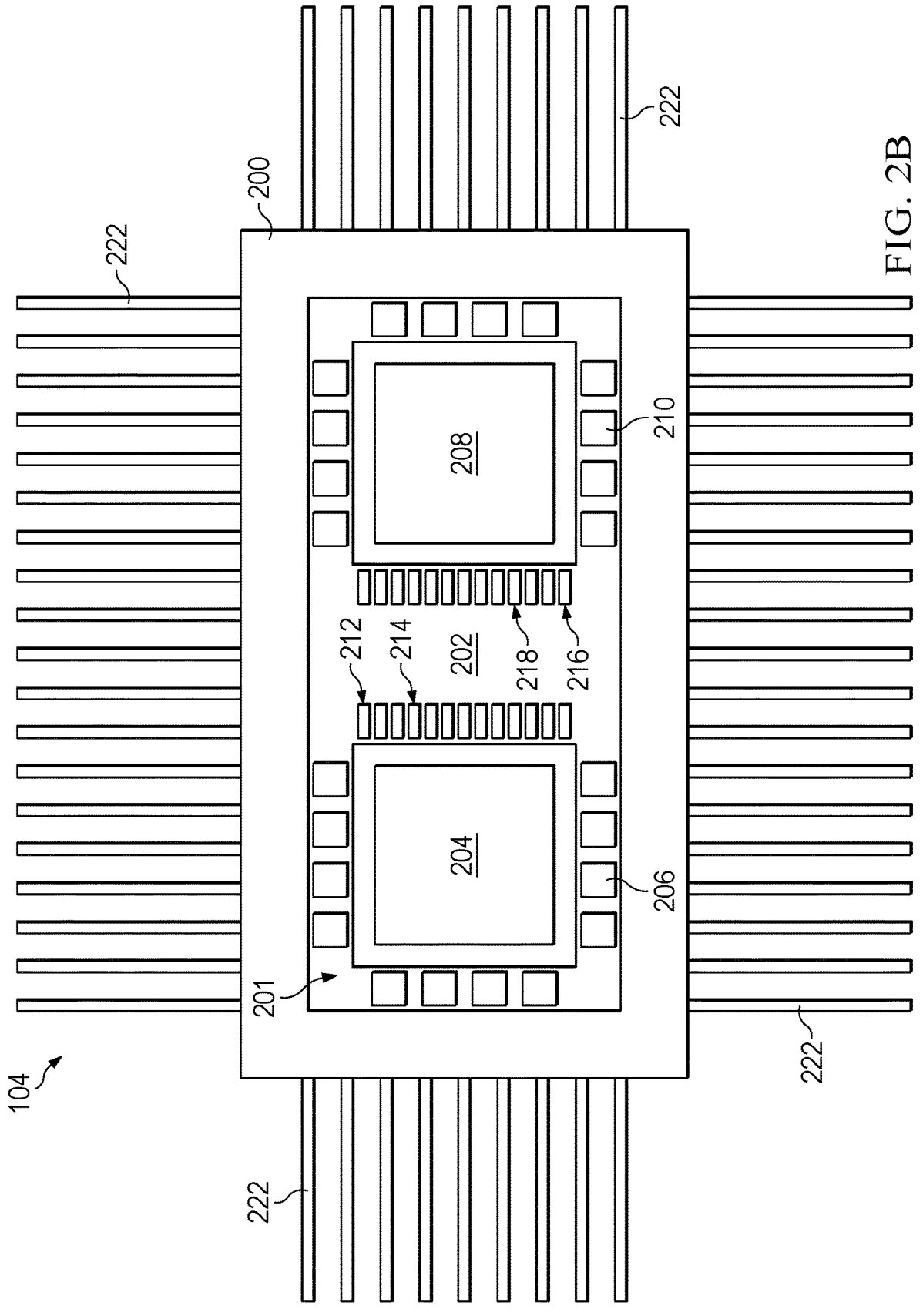
Figure 2C:
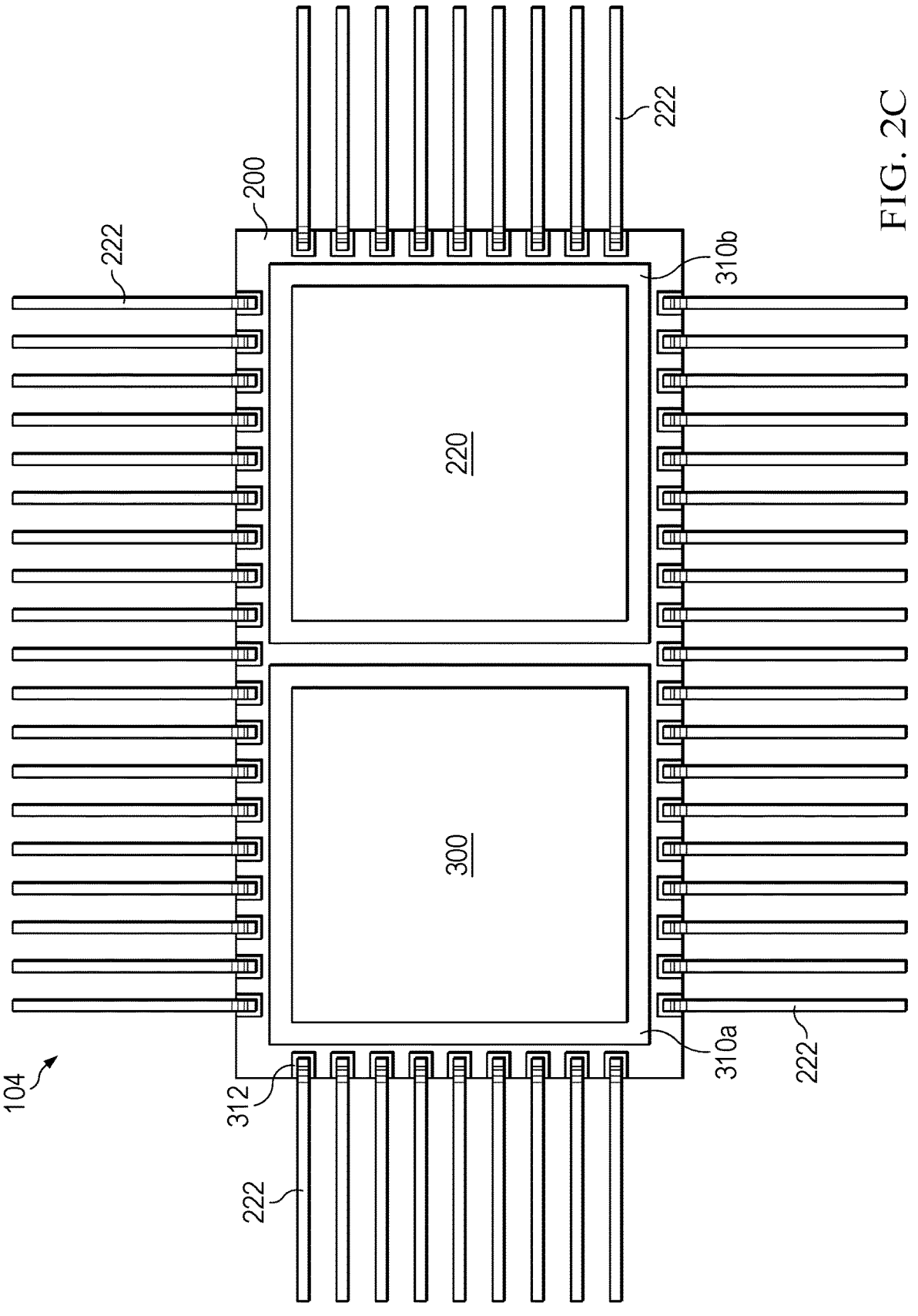

FIGS. 2A, 2B, and 2C are perspective, top-down, and bottom-up views, respectively, of a ceramic semiconductor package 104, in accordance with various examples. As depicted in FIG. 2A, the ceramic semiconductor package (or, more simply, package) 104 includes a ceramic body 200. The ceramic body 200 includes a cavity 201 within which a ceramic member 202 is positioned. The ceramic member 202 is part of the ceramic body 200. The cavity 201 also includes a semiconductor die 204 and a semiconductor die 208 on either side of the ceramic member 202. The ceramic body 200 includes bond pads 206 positioned along at least some edges of the semiconductor die 204. Similarly, the ceramic body 200 includes bond pads 210 positioned along at least some edges of the semiconductor die 208. The cavity 201 also includes conductors 214 and conductors 218 in and/or on the ceramic member 202. In examples, the conductor 214 is composed of molybdenum, although a variety of other metals and alloys (e.g., copper) are included in the scope of this disclosure. In examples, different segments of conductor 218 are composed of different metals, such as copper tungsten and molybdenum, although other metals and alloys may be used. Other conductive structures described herein may be composed of the same or similar materials (e.g., tungsten, copper). In FIG. 2A, the top surfaces of the conductors 214, 218 are visible, with a remainder of the conductors 214, 218 positioned within the ceramic member 202, as described below. In other examples, the conductors 214, 218 are positioned on a top surface of the ceramic member 202, with no portion of either of the conductors 214, 218 positioned within the ceramic member 202.

The ceramic member 202 may also include ground shields 212 and ground shields 216. The ground shields 212 may be interspersed among the conductors 214 in an alternating pattern, as shown, such that a ground shield 212 is present between each pair of consecutive conductors 214 and a conductor 214 is present between each pair of consecutive ground shields 212. Similarly, the ground shields 216 may be interspersed among the conductors 218 in an alternating pattern, as shown, such that a ground shield 216 is present between each pair of consecutive conductors 218 and a conductor 218 is present between each pair of consecutive ground shields 216. As described below, the conductors 214, 218 (e.g., a portion of the conductor 218 embedded within the ceramic member 202 and not visible in FIG. 2A), together with the ceramic member 202, form capacitors, with the conductors 214, 218 serving as metal capacitor plates and the ceramic member 202 serving as a dielectric positioned between the metal capacitor plates. As also described below, the conductors 214, 218, together with the air between the conductors 214, 218, form capacitors, with the conductors 214, 218 serving as metal capacitor plates and the air serving as a dielectric positioned between the metal capacitor plates.

Still referring to FIG. 2A, a heatsink 220 is coupled to a bottom surface (e.g., non-device side) of the semiconductor die 208. A heatsink (not expressly shown) may also be coupled to a non-device side of the semiconductor die 204. Leads 222 are coupled to conductors (not shown in FIG. 2A) that extend through the ceramic body 200 and that are coupled to bond pads 206 or 210 on one end and that are exposed to a bottom surface of the ceramic body 200 at the opposing end.

FIG. 2B is a top-down view of the structure of FIG. 2A. FIG. 2C is a bottom-up view of the structure of FIG. 2A. Numerals 300, 310a, 310b, and 312 are depicted in FIG. 2C but are described below.

Figure 3A:
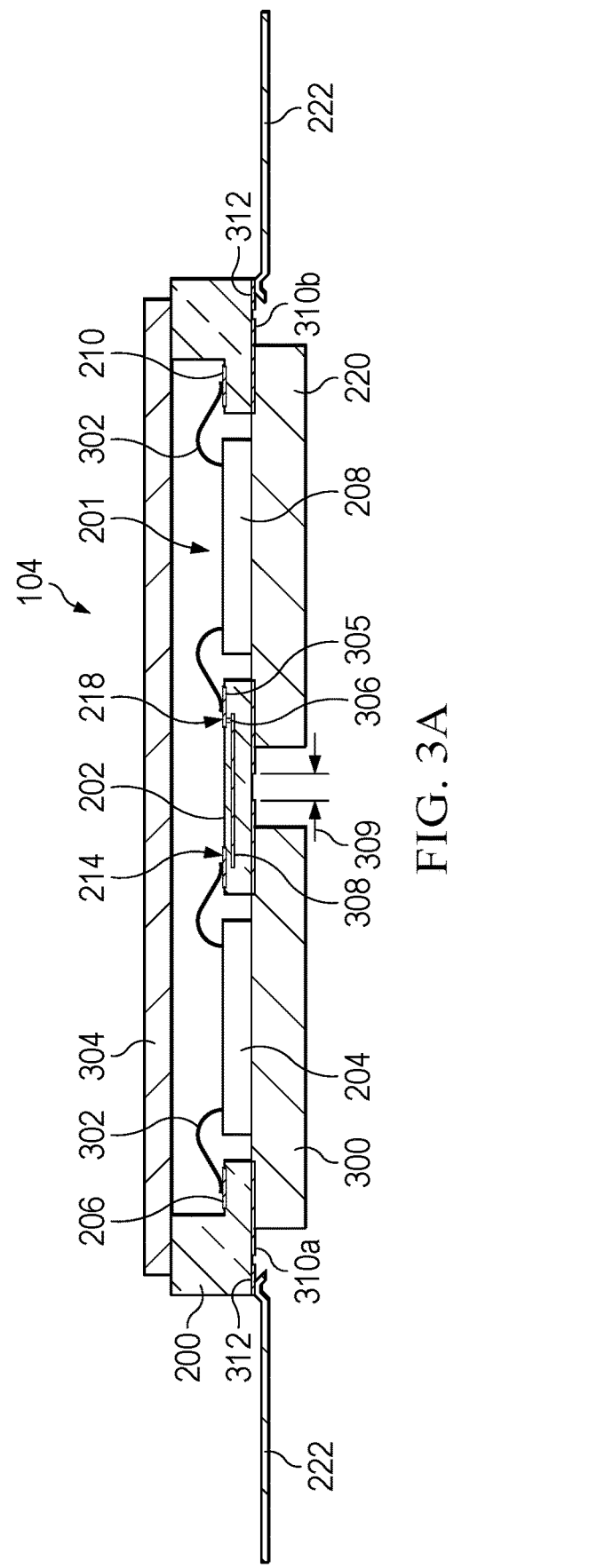
FIGS. 3A, 3B, 3C, and 3D are cross-sectional views of various portions of a semiconductor package having a ceramic member useful as a capacitor dielectric, in accordance with various examples.

FIG. 3A is a cross-sectional view of various portions of the package 104. The package 104 includes the cavity 201. The cavity 201 includes semiconductor dies 204, 208 coupled to heatsinks 300, 220, respectively. A device side of the semiconductor die 204 is coupled to bond pads 206 by bond wires 302. Similarly, a device side of the semiconductor die 208 is coupled to bond pads 210 by bond wires 302. Although not expressly shown, the bond pads 206, 210 may be coupled to a network of conductors embedded in the ceramic body 200 that terminates at terminals 312. The terminals 312, in turn, are coupled to leads 222. The terminals 312 have a dog leg shape when the lead pitch is less than 0.635 mm. The terminals 312 have a flat lead shape when the lead pitch is greater than 0.635 mm. Thus, one or more electrical pathways are present between bond pads 206 and leads 222, and similarly, one or more electrical pathways are present between bond pads 210 and leads 222. A lid 304 (e.g., a metal lid) may be coupled to the ceramic body 200 to protect the contents of the cavity 201. The lid 304 may be useful, e.g., to avoid space charging when in orbit.

The ceramic member 202 includes conductors 214 and 218, as described above. Although the ceramic member 202 also includes ground shields 212, 216, the ground shields 212, 216 are not visible in the cross-section of FIG. 3A. (FIGS. 3C and 3D are cross-sections showing the ground shields 212, 216, and they are described below.) The conductor 218 includes multiple members 305, 306, and 308. Member 305 may be composed of copper tungsten in some examples. Member 306 may be composed of molybdenum in some examples. Member 308 may be composed of copper tungsten in some examples. The conductor 214 and the member 305 are exposed to a top surface of the ceramic member 202. The member 306 extends vertically through a portion of the ceramic member 202 and is coupled to the members 305, 308. The member 308 extends horizontally through a portion of the ceramic member 202. In examples, the member 308 is approximately parallel to one or more of the conductor 214 and the member 305. In examples, the member 308 and the conductor 214 at least partially overlap in the vertical direction. In other words, one or more vertical planes may pass through both the member 308 and the conductor 214. In examples, the conductor 214 and the member 305 have surfaces facing each other, and these surfaces are approximately parallel and separated by air. In this way, a capacitor is formed between the conductor 214 and the member 305 with air as the dielectric. Similarly, a capacitor is formed between the conductor 214 and the member 308, with ceramic in the ceramic member 202 as the dielectric. Both of these capacitors have one terminal at conductor 214 and the other terminal at member 305. Thus, these two capacitors are in parallel with each other, and they together may be considered to form a single capacitor having a capacitance that is the combination of the capacitances of the two parallel capacitors (e.g., providing a combined capacitance of approximately 69 fF or less; providing a combined capacitance of approximately 65 fF or less). The semiconductor die 204 may be coupled to the conductor 214 by a bond wire 302, and the semiconductor die 208 may be coupled to the conductor 218 by a bond wire 302.

In examples, the package 104 includes ground planes 310*a*, 310*b*. The ground planes 310*a*, 310*b* are in separate domains such that a voltage differential exists between the ground planes 310*a*, 310*b*. For example, the semiconductor die 204 may be in a high-voltage domain and the ground plane 310*a* may thus also be in the high-voltage domain, and, conversely, the semiconductor die 208 may be in a low-voltage domain and the ground plane 310*b* may thus be in the low-voltage domain. In examples, there are no physical, electrical pathways or connections between the two voltage domains. In such examples, the capacitors in the ceramic member 202 described herein may serve to provide both isolation and communication between the two domains. The ground planes 310*a*, 310*b* may be positioned as desired, but in the example of FIG. 3A, the ground planes 310*a*, 310*b* circumscribe top surfaces of the heatsinks 300, 220, respectively. A distance 309 between the edges of the ground planes 310*a*, 310*b* closest to each other ranges from 320 microns to 580 microns, with a distance less than this range being disadvantageous because capacitance levels are undesirably increased and with a distance greater than this range being disadvantageous because capacitance levels are undesirably decreased. In some examples, such as in FIG. 3A, the heatsinks 220, 300 include multiple top surfaces in different horizontal planes, with the ground planes 310*a*, 310*b* positioned such that the top surfaces of the ground planes 310*a*, 310*b* and the respective bottom surfaces of the semiconductor dies 204, 208 are approximately co-planar. In other examples, the heatsinks 220, 300 each includes a single top surface, and the respective semiconductor die 204, 208 and ground planes 310*a*, 310*b* rest on that single top surface, such that the bottom surfaces of the semiconductor dies 204, 208 and the ground planes 310*a*, 310*b* are approximately co-planar. Various other shapes, positions, and configurations of the ground planes 310*a*, 310*b* are contemplated and included in the scope of this disclosure.

Figure 3B:
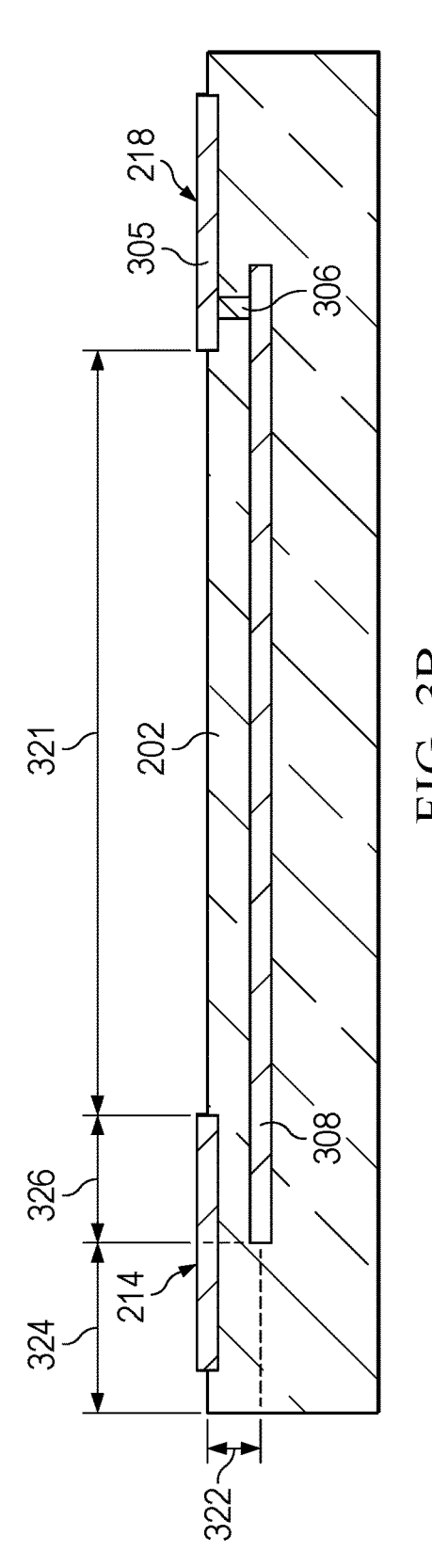
Figures 3C, 3D:
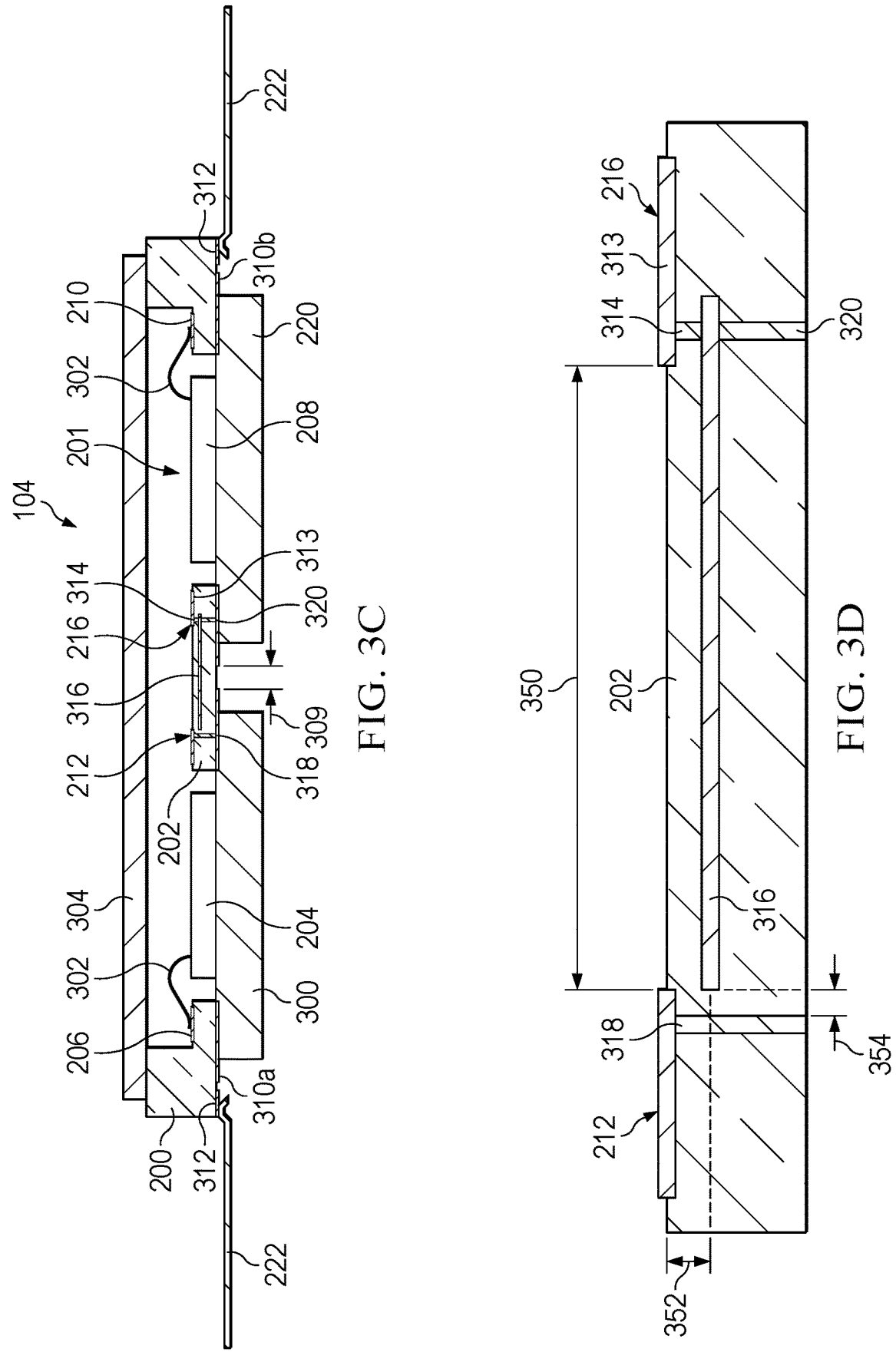
Figure 4A:
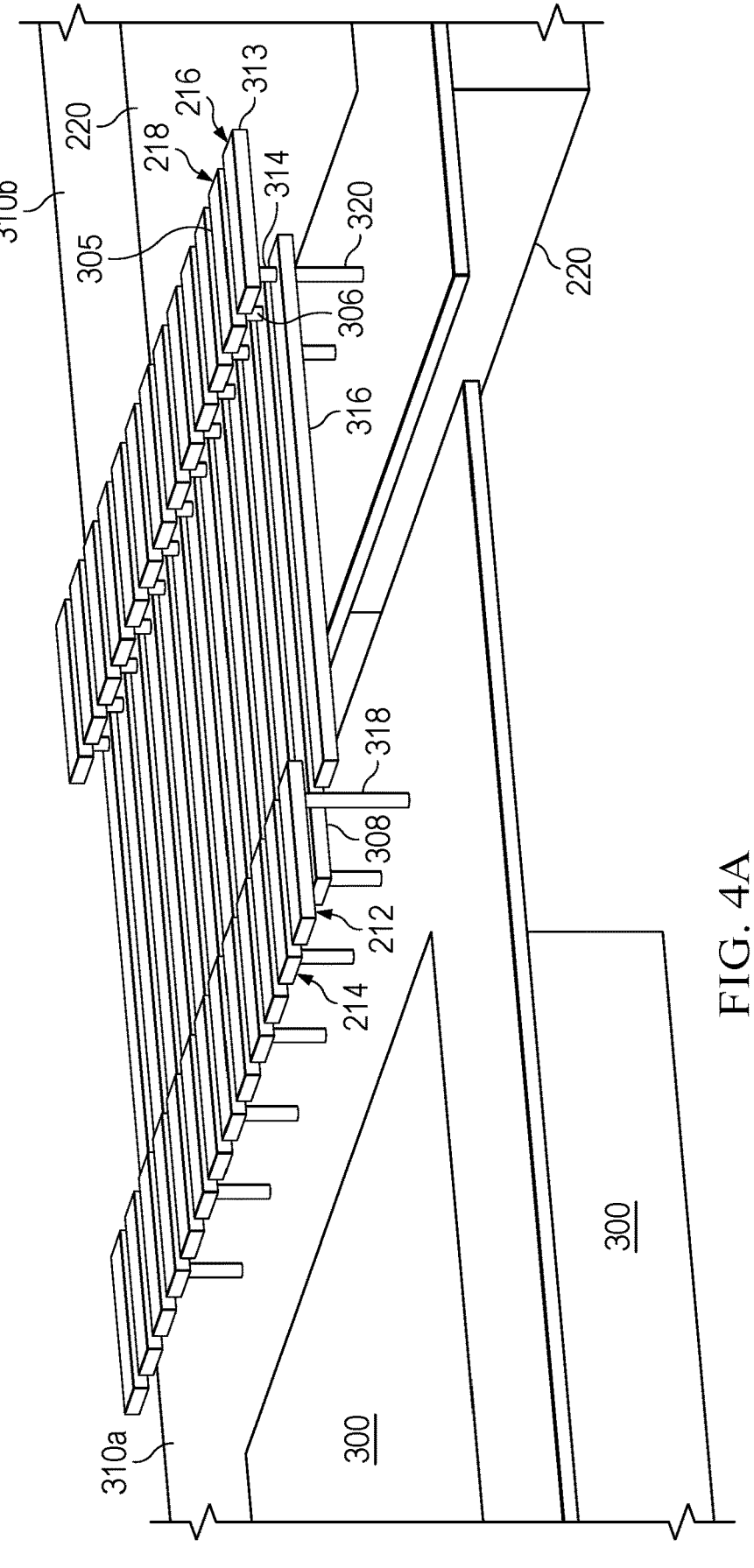
FIGS. 4A, 4B, 4C, and 4D are perspective, profile, profile, and top-down views, respectively, of ground shields and metal capacitor plates in accordance with various examples.
Figures 4B, 4C:
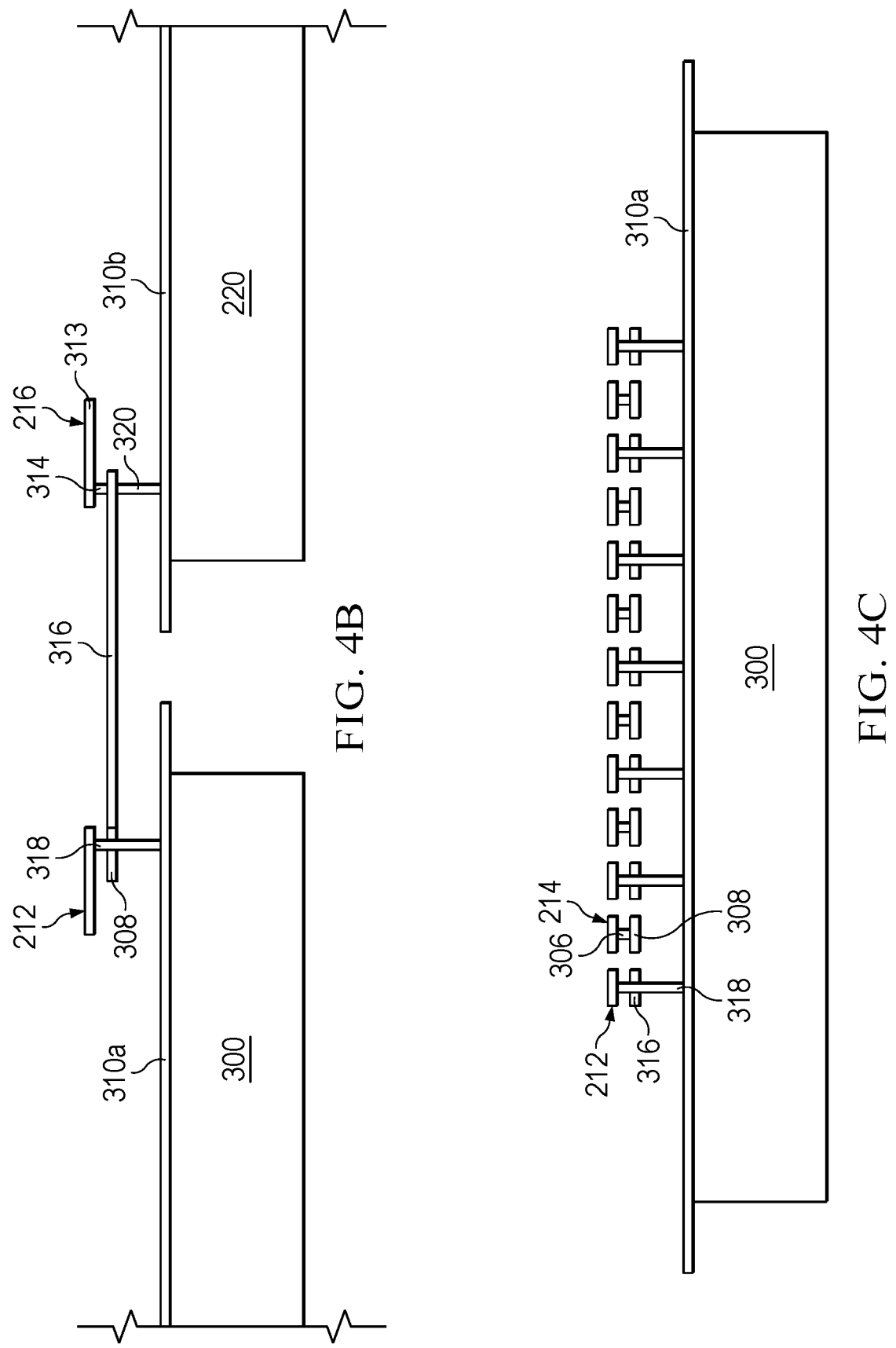
Figure 4D:
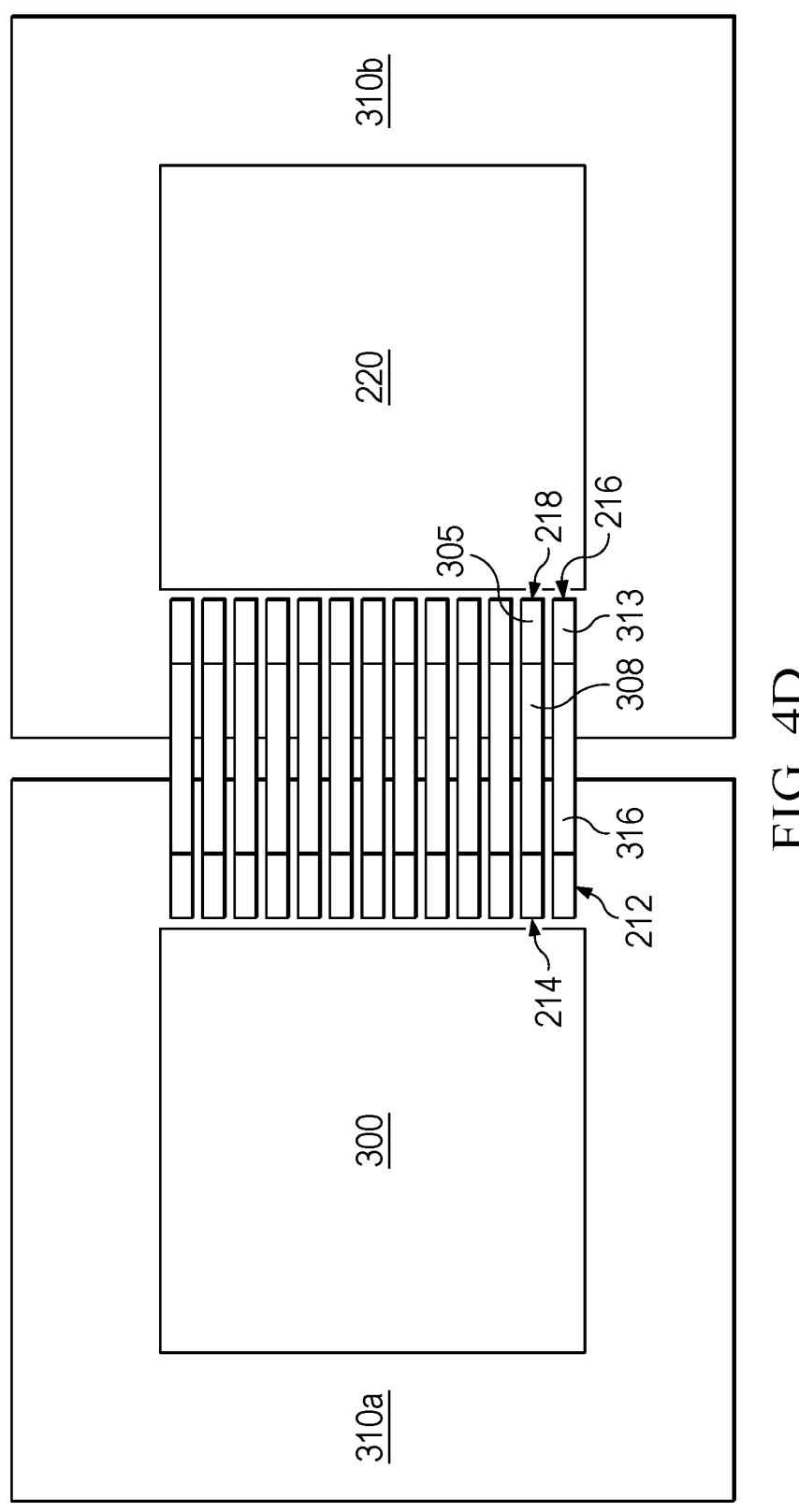

FIG. 3B is a close-up view of the example ceramic member 202 and its contents as depicted in the cross-sectional view of FIG. 3A. The ceramic member 202 has a thickness ranging from 440 microns to 560 microns. The ceramic member 202 has a dielectric constant of 9.0 to 9.5, with a constant less than this range being disadvantageous because it unacceptably increases capacitance and with a constant greater than this range being disadvantageous because it unacceptably decreases capacitance. A gap 321 between the conductor 214 and member 305 contains air and ranges from 1638 microns to 1658 microns, with a gap less than this range being disadvantageous because it unacceptably increases capacitance and with a gap greater than this range being disadvantageous because it unacceptably decreases capacitance. A larger gap 321 produces a smaller capacitance between the conductor 214 and member 305, and a smaller gap 321 produces a larger capacitance between the conductor 214 and member 305. The smaller of the surface areas of the conductor 214 and member 305 affects the capacitance between the conductor 214 and member

305, with a larger value producing a larger capacitance and a smaller value producing a smaller capacitance. The smaller of the surface areas of the conductor 214, which ranges from 154,170 microns$^2$ to 171,390 microns$^2$ and member 305, which ranges from 108,490 microns$^2$ to 124,110 microns$^2$, with smaller surface areas being disadvantageous because the capacitance is unacceptably decreased, and with a larger surface area being disadvantageous because the capacitance is unacceptably increased and beyond 69 fF. In some examples, the gap 321 is filled with a dielectric other than air, such as a ceramic.

A gap 322 between the conductor 214 and member 308 ranges from 120 microns to 180 microns, with a gap less than this range being disadvantageous because the capacitance is unacceptably increased and with a gap greater than this range being disadvantageous because the capacitance is unacceptably decreased. A larger gap 322 produces a smaller capacitance between the conductor 214 and member 308, and a smaller gap 322 produces a larger capacitance between the conductor 214 and member 308. The smaller of the surface areas of the conductor 214 and member 308 (i.e., the vertically overlapping portions of the conductor 214 and member 308) affects the capacitance between the conductor 214 and member 308, with a larger value producing a larger capacitance and a smaller value producing a smaller capacitance. The smaller of the surface areas of the conductor 214 and member 308 ranges from 44,100 microns$^2$ to 53,200 microns$^2$, with a smaller surface area being disadvantageous because it unacceptably decreases the capacitance, and with a larger surface area being disadvantageous because it unacceptably increases the capacitance.

As described above, the conductor 214 and the member 308 are at least partially in vertical alignment with each other. This alignment, which may also be referred to as an overlap 326, is useful to produce a capacitance between the conductor 214 and the member 308. The overlap 326 provides the majority of the capacitance that is produced and does so in a predictable manner. The overlap 326 ranges from 210 microns to 280 microns, with an overlap smaller than this range being disadvantageous because the capacitance is unacceptably decreased and with an overlap greater than this range being disadvantageous because the capacitance is unacceptably increased. Generally, a smaller overlap 326 results in decreased capacitance, while a larger overlap 326 results in Increased capacitance. The overlap also may be considered in terms of overlap in area. Specifically, the overlap 326 may have a two-dimensional area in the horizontal plane ranging from 44,100 microns$^2$ to 53,200 microns$^2$, with an overlapping area less than this range being disadvantageous because it unacceptably decreases capacitance and with an overlapping area greater than this range being disadvantageous because it unacceptably increases capacitance. An end of the member 308 closest to the conductor 214 is spaced apart from a closest vertical surface of the ceramic member 202 by a gap 324. The gap 324 affects the degree of overlap 326. If the gap 324 is smaller, the degree of overlap 326 is increased, and this increases capacitance. If the gap 324 is larger, the degree of overlap 326 is decreased, and this decreases capacitance.

FIG. 3C is another cross-sectional view of the example package 104. In the cross-section of FIG. 3C, the ceramic member 202 is shown to contain ground shields 212, 216. The ground shield 212 is similar to the conductor 214 of FIGS. 3A and 3B, except that it is coupled to the ground plane 310*a* by way of a conductive via 318. The ground shield 216 is similar to the conductor 218 and includes members 313, 314, and 316. However, unlike the conductor

218, the ground shield 216 is coupled to the ground plane 310*b* by way of a conductive via 320. Because the ground shields 212, 216 are positioned in between consecutive capacitors, such as those depicted in FIGS. 3A and 3B, the ground shields 212, 216 prevent capacitive coupling between consecutive capacitors. The ground shields 212 have surface areas ranging from 108,490 microns$^2$ to 124,110 microns$^2$, with excursions beyond this range being disadvantageous due to unacceptable degrees of capacitive coupling between capacitors. The ground shields 216 have surface areas ranging from 108,490 microns$^2$ to 124,110 microns$^2$, with excursions beyond this range being disadvantageous due to unacceptable degrees of capacitive coupling between capacitors. The spacing between each ground shield 212 and the closest capacitor to that ground shield 212 ranges from 106 microns to 126 microns, and the spacing between each ground shield 216 and the closest capacitor to that ground shield 216 ranges from 146 microns to 166 microns, with excursions beyond these ranges being disadvantageous due to unacceptable degrees of capacitive coupling between capacitors. In examples, the member 316 does not vertically coincide with the ground shield 212, meaning that the member 316 and the ground shield 212 do not share a common vertical plane.

FIG. 3D is a close-up view of the example ceramic member 202 and its contents as depicted in the cross-sectional view of FIG. 3B. A gap 350 between the ground shield 212 and member 313 ranges from 1638 microns to 1658 microns, with a gap less than this range being disadvantageous because it unacceptably increases capacitance, and with a gap greater than this range being disadvantageous because it unacceptably decreases capacitance. The surface areas of the members 313, 314, 316 and the ground shield 212 affect package ground capacitance (e.g., between high-side and low-side ground) and degrees of capacitive coupling.

The size of a vertical gap 352 between the ground shield 212 and member 316 ranges from 120 microns to 180 microns, with a gap less than this range being disadvantageous because the capacitance is unacceptably increased and with a gap greater than this range being disadvantageous because the capacitance is unacceptably decreased.

An end of the member 316 closest to the ground shield 212 is spaced apart from a closest vertical surface of the ceramic member 202 by a gap 354. The gap 354 is at least 111.5 microns, with a gap 354 smaller than this range causing shorting during manufacture. In some examples, the gap 354 is filled with a dielectric other than air, such as a ceramic.

FIGS. 4A, 4B, 4C, and 4D are perspective, profile, profile, and top-down views, respectively, of various components of the package 104, in accordance with various examples. FIGS. 4A-4D omit the ceramic member 202 but depicts structures (e.g., capacitors, ground shields) within the ceramic member 202 so that these structures can be more readily visualized. As shown, ground shields are interspersed among the capacitors in an alternating pattern such that at least one ground shield is present between each consecutive pair of capacitors. More specifically, ground shields 212 are interspersed among the conductors 214 in an alternating pattern, and ground shields 216 are interspersed among the conductors 218 in an alternating pattern. The ground shields 212 are coupled to ground plane 310*a* by way of conductive vias 318, and the ground shields 216 are coupled to ground plane 310*b* by way of conductive vias 320.

FIG. 5 is a flow diagram of a method 500 for manufacturing the semiconductor package 104, in accordance with various examples. The method 500 may include forming a ceramic body of the package 104, including a ceramic member (e.g., ceramic member 202) having capacitor plates (e.g., conductors 214, 218) and ground shields (e.g., ground shields 212, 216), with the ground shields coupled to ground planes (e.g., ground planes 310*a*, 310*b*) (502). Any suitable technique may be useful for forming the ceramic body and the conductors therein, including dry pressing techniques, multilayering techniques, etc. The method 500 may include coupling heat sinks to the package 104, for example, to the ceramic body of the package 104 using ground planes 310*a*, 310*b*, as illustrated in FIG. 3A (504). The method 500 may further include coupling semiconductor dies (e.g., semiconductor dies 204, 208) to the heat sinks (506). The method 500 may include wirebonding the semiconductor dies to bond pads (e.g., bond pads 206, 210), capacitor plates (e.g., conductors 214, 218), and ground shields (e.g., ground shields 212, 216) (508). The method 500 includes coupling a lid (e.g., lid 304) to the top of the semiconductor package 104 (510). The method 500 comprises coupling leads (e.g., leads 222) to the semiconductor package 104, for example, to the terminals 312 (512). The semiconductor package 104 may then be coupled to a PCB using the leads.

Uses of the phrase "ground" in the foregoing description may include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a parameter means being within +/−15 percent of that parameter. Modifications are possible in the described examples, and other examples are possible within the scope of the claims.

What is claimed is:

1. A ceramic semiconductor package, comprising:
a first semiconductor die;
a second semiconductor die; and
a ceramic body including a ceramic member, the ceramic member comprising:
  a first conductor on a top surface of the ceramic member; and
  a second conductor including:
    a first member on the top surface of the ceramic member and separated from the first conductor, the first member coupled to a device side of the first semiconductor die; and
    a second member coupled to the first member by a vertical member, the second member extending horizontally within the ceramic member parallel to and coinciding vertically with the first conductor, the second member coupled to a device side of the second semiconductor die.

2. The ceramic semiconductor package of claim 1, further comprising a first ground conductor on the top surface of the ceramic member and a second ground conductor having a first ground member on the top surface and a second ground member inside the ceramic member.

3. The ceramic semiconductor package of claim 2, wherein the second ground member and the first ground conductor do not vertically coincide.

4. The ceramic semiconductor package of claim 2, further comprising a first heatsink coupled to a non-device side of the first semiconductor die, wherein the first ground conductor is coupled to the first heatsink by a first via extending vertically through the ceramic member.

5. The ceramic semiconductor package of claim 4, further comprising a second heatsink coupled to a non-device side of the second semiconductor die, wherein the second ground conductor is coupled to the second heatsink by a second via extending vertically through the ceramic member.

6. The ceramic semiconductor package of claim 1, wherein the first conductor and the first member are configured to produce a first capacitance and the first conductor and the second member are configured to produce a second capacitance, the first and second capacitances combining to form a total capacitance of no more than 69 femtofarads (fF).

7. The ceramic semiconductor package of claim 1, wherein a vertical gap between the first conductor and the second member ranges between 120 microns and 180 microns.

8. The ceramic semiconductor package of claim 1, wherein the first conductor and the second member vertically coincide along a portion of the second member, the portion having a length ranging from 210 microns to 280 microns.

9. The ceramic semiconductor package of claim 1, wherein the first conductor and the first member are separated by a gap ranging from 1.638 mm to 1.658 mm.

10. A ceramic semiconductor package, comprising:
a first semiconductor die;
a second semiconductor die; and
a ceramic body including a ceramic member, the ceramic member positioned between the first and second semiconductor dies, the ceramic member comprising:
a first set of conductors coupled to the first semiconductor die and on a top surface of the ceramic member;
a second set of conductors coupled to the second semiconductor die, each conductor in the second set of conductors having a first member on the top surface and having a second member within the ceramic member, the second member parallel to the top surface;
a first set of ground conductors interspersed between the first set of conductors, the first set of ground conductors adapted to be coupled to ground; and
a second set of ground conductors interspersed between the second set of conductors, the second set of ground conductors adapted to be coupled to ground.

11. The ceramic semiconductor package of claim 10, wherein ground conductors in the first set of ground conductors and conductors in the first set of conductors are configured in an alternating pattern.

12. The ceramic semiconductor package of claim 10, wherein ground conductors in the second set of ground conductors and conductors in the second set of conductors are configured in an alternating pattern.

13. The ceramic semiconductor package of claim 10, wherein a conductor in the first set of conductors vertically coincides with one of the second members.

14. The ceramic semiconductor package of claim 10, wherein the first set of ground conductors do not vertically coincide with the second set of ground conductors.

15. The ceramic semiconductor package of claim 10, wherein a conductor in the first set of conductors and a conductor in the second set of conductors are configured to provide a capacitance no greater than 69 femtofarads (fF).

16. The ceramic semiconductor package of claim 10, further comprising a first heatsink coupled to a non-device side of the first semiconductor die, the first set of ground conductors adapted to be coupled to ground by way of the first heatsink.

17. The ceramic semiconductor package of claim 10, further comprising a second heatsink coupled to a non-device side of the second semiconductor die, the second set of ground conductors adapted to be coupled to ground by way of the second heatsink.

18. A ceramic semiconductor package, comprising:
a ceramic body;
a first capacitor including a pair of parallel conductors and a portion of the ceramic body positioned between the pair of parallel conductors;
a second capacitor including a pair of conductors separated by air, the second capacitor electrically parallel with the first capacitor; and
first and second semiconductor dies, each die coupled to the first and second capacitors.

19. The ceramic semiconductor package of claim 18, wherein the pair of parallel conductors and the pair of conductors have a conductor in common.

20. The ceramic semiconductor package of claim 18, wherein the first and second capacitors are configured to produce a combined capacitance not exceeding 69 femtofarads (fF).

* * * * *